United States Patent [19]

Nishizawa

[11] Patent Number: 4,783,426

[45] Date of Patent: Nov. 8, 1988

[54] METHOD OF MAKING A GROUP II-VI COMPOUND SEMICONDUCTOR DEVICE BY SOLUTION GROWTH

[75] Inventor: Jun-ichi Nishizawa, Sendai, Japan

[73] Assignee: Zaidan Hojin Handotai Kenkyu Shinkokai, Sendai, Japan

[21] Appl. No.: 124,390

[22] Filed: Nov. 19, 1987

Related U.S. Application Data

[60] Division of Ser. No. 814,151, Dec. 23, 1985, abandoned, which is a continuation of Ser. No. 424,301, Sep. 27, 1982, abandoned.

[30] Foreign Application Priority Data

Oct. 9, 1981 [JP] Japan ................................. 56-161837

[51] Int. Cl.$^4$ ................................. H01L 21/368
[52] U.S. Cl. ............................. 437/81; 156/605; 156/607; 156/624; 437/167; 437/905; 357/17
[58] Field of Search ............... 437/81, 114, 167, 905; 156/605, 607, 624

[56] References Cited

U.S. PATENT DOCUMENTS

| | | | |
|---|---|---|---|
| 3,224,912 | 12/1965 | Ruehwein | 357/63 |
| 3,447,234 | 6/1969 | Reynolds et al. | 357/63 |
| 3,483,028 | 12/1969 | Bell et al. | 357/63 |
| 3,732,471 | 5/1973 | Hou et al. | 357/63 |
| 3,743,553 | 7/1973 | Scott et al. | 357/63 |
| 4,105,478 | 8/1978 | Johnson | 357/30 |
| 4,143,235 | 3/1979 | Duisman | 357/61 |
| 4,422,888 | 12/1983 | Stutius | 357/61 |
| 4,465,527 | 8/1984 | Nishizawa | 437/114 |
| 4,526,632 | 7/1985 | Nishizawa et al. | 357/63 |
| 4,572,763 | 2/1986 | Nishizawa | 156/624 |
| 4,685,979 | 8/1987 | Nishizawa | 437/81 |
| 4,692,194 | 9/1987 | Nishizawa | 156/624 X |
| 4,725,563 | 2/1988 | Nishizawa | 437/114 |

OTHER PUBLICATIONS

Crowder et al., *Physical Review*, vol. 150, No. 2, Oct. 14 1966, "Shallow Acceptor States in ZnTe and CdTe" pp. 541–545.

*Primary Examiner*—George T. Ozaki
*Attorney, Agent, or Firm*—Cushman, Darby & Cushman

[57] ABSTRACT

A semiconductor device made of a II–VI compound semiconductor and having a p type semiconductor crystal. The p type semiconductor crystal is one obtained by growing the II–VI compound semiconductor crystal by relying on a liquid phase crystal growth process using a solvent comprised of one of Group II and Group VI elements constituting the Group II–VI compound semiconductor and having a higher vapor pressure over the other of these elements in an atmosphere comprised of the other of the elements having a lower vapor pressure under controlled vapor pressure of the atmosphere, and by doping into the solvent a p type impurity element selected from Group Ia and Ib elements in an amount of a range from $1\times10^{-3}$ to $5\times10^{-1}$ mol %. Thus, p type semiconductor crystals for use in semiconductor devices can be obtained easily from II–VI compound semiconductors. The present invention is especially effective in ZnSe crystals.

12 Claims, 3 Drawing Sheets

METHOD OF MAKING A GROUP II-VI COMPOUND SEMICONDUCTOR DEVICE BY SOLUTION GROWTH

This is a division of application Ser. No. 814,151, filed Dec. 23, 1985, which was abandoned upon the filing hereof and which was a continuation of Ser. No. 424,301 filed Sept. 27, 1982, now abandoned.

BACKGROUND OF THE INVENTION (a) Field of the Invention

The present invention concerns a semiconductor device having a p type semiconductor region made with a II-VI compound semiconductor material, and more particularly it relates to such a semiconductor device whose p type semiconductor region is obtained by doping a Group Ia element of the Periodic Table into a II-VI compound semiconductor material.

(b) Description of the Prior Art

Such Group II-VI compound semiconductor materials as ZnS, ZnSe, CdS and CdSe, as is well known, are direct band gap semiconductors as in the case of GaAs which is one of Group III-V compound semiconductors in which the lowest conduction band minimum and the highest valence band maximum are both at a same wave vector in the Brillouin zone. That is, Group II-VI compound semiconductor materials are of the direct transition type with respect to electronic transition as in the case of GaAs.

In addition to the property mentioned above, II-VI compound semiconductor materials, in general, are characterized by their wide energy band gaps. Thus, they are considered to be attractive as semiconductor materials in that they allow us to expect properties which cannot be obtained by III-V compound semiconductors including GaAs.

However, owing to various reasons including the difficulty of obtaining stoichiometry of II-VI compounds, studies concerning II-VI compound semiconductors have not made much development yet as compared with the studies of III-V compound semiconductors. Therefore, it is the present status of the art that the characteristics of II-VI compound semiconductors have not been sufficiently utilized in the field of semiconductor devices.

Detailed reasons therefor will be described later, but the general reason is that it is relatively easy to produce II-VI compound semiconductors with the n type conductivity, however it is rather difficult to produce p type crystals. It should be understood, of course, that conversely there are those II-VI compound semiconductors from which p type crystals can be made relatively easily but for which the growth of n type crystals is not easy. Those semiconductor devices manufactured at present with II-VI compound semiconductors are represented typically by photoconductors which use a semiconductor bulk having either one of the conductivity types. Those devices having an impurity-controlled pn junction formed with a same substrate have not yet reached the stage of being actually practiced. If, as in the case of the semiconductor devices using III-V compound semiconductors, the above-mentioned difficulty which prevails at present is overcome, and if there can be obtained, at will, II-VI compound semiconductor materials having either the p type or the n type just by controlling the doping of the impurity elements, it is certain that the scope of their use and application will become drastically broadened.

Some discussion will be made hereunder of the present state, as well as, the problems of the II-VI compound semiconductors.

The energy band gaps of reliable respective crystals of II-VI compound semiconductors which have been reported and their conductivity types which are obtained according to the ordinary known techniques are shown in the following Table 1.

TABLE 1

|  | ZnS | ZnSe | ZnTe | CdS | CdSe | CdTe |
|---|---|---|---|---|---|---|
| Conductivity type | n | n | p | n | n | n · p |
| Energy band gap $E_g$(eV) | 3.6 | 2.67 | 2.2 | 2.5 | 1.74 | 1.5 |

As will be understood from Table 1, the crystals of II-VI compound semiconductors are such that there can be obtained crystals having only either one of the n type and p type, except for the CdTe crystal. Especially, ZnSe crystal has a large energy band gap: $E_g$ of 2.67 eV, as compared with that of GaAs (its $E_g$ is about 1.43 eV) and with that of GaP (its $E_g$ is about 2.26 eV) of the III-V compound semiconductors. Thus, if a diode having a pn junction can be manufactured with a ZnSe crystal, it will be a semiconductor material suitable for obtaining a blue light emitting diode whose light emission spectra at room temperature is in the blue range. This could not have been realized in the past. However, as also shown in Table 1, the level of technology has not yet risen high enough as to provide crystals of both the p type and the n type at will just by controlling the conductivity types of the crystals. Therefore, efforts are being made energetically at various laboratories throughout the world to realize the above-mentioned purpose, and various reports have been presented so far with respect to the formation of pn junctions.

Among the recent reports conveying the success in the formation of a pn junction, a relatively reliable one concerns the acquisition of a pn junction by using an n type ZnSe crystal obtained by the usual manufacturing method, and by the ion implantation into this n type ZnSe crystal, of either phosphorus (P) atoms or arsenic (As) atoms which serve as a p type impurity by its substantial occupation of the lattice sites of the Se atoms, by relying on the ion implantation technique.

However, a study has been made of the characteristic of light emission spectra of the light-emitting diode (LED) thus obtained, by causing a forward current to flow through this diode. It has been found that the light emission due to recombination via the deep level is dominant. There has not been observed light emission due to recombination corresponding to the value of the energy band gap, or of a value close to the energy band gap.

The problems of II-VI compound semiconductors stated above are considered to be due roughly to the following two reasons.

The first concerns imperfection of the semiconductor crystal. In such II-VI compound semiconductors as ZnS, ZnSe, CdS and CdSe, Group VI elements in general have a higher vapor pressure than Group II elements. Accordingly, in crystals which are obtained by a growth step conducted at a high temperature, it will occur that, during the growth of the crystal, the Group II element having a high vapor pressure will become scarce due to its vaporization out of the crystal, thereby resulting in a deviation from stoichiometric composition. More particularly, it is usual that vacancies of the Group VI element develop in a large number. These vacancies act as the donor. Accordingly, only an n type crystal is obtained ordinarily, and no practical p type crystal can be obtained easily. Thus, as a matter of course, it is difficult to produce a device having a pn junction. Vacancies of the Group VI element tend to any combination of the impurity to form complex centers, and these complex centers will become non-radiative recombination centers or deep levels. Accordingly, even when a pn junction is formed, an LED having such pn junction will have a very weak light emission efficiency, or the light emission from deep levels will become dominant.

As such, in order to obtain an LED capable of providing a light emission corresponding to the value of the energy band gap by the use of a II-VI compound semiconductor material, there has to be formed a pn junction with a crystal having a high crystal perfection not containing either such non-radiative recombination centers or deep levels. Demand has been presented for the development of a technique to form such a desirable pn junction as mentioned just above.

The second important reason is that the following demand has not been satisfied yet. That is, when an impurity element for determining the conductivity type of the crystal is doped in a II-VI compound semiconductor, the level of such impurity as will become either the donor level or the acceptor level which is formed in the forbidden band is positioned in the bottom of the conduction band or close to the top of the valence band, i.e. it has been desired to be a shallow impurity level.

As the impurity elements for producing the p type conductivity in II-VI compound semiconductors, there are considered, for example, Group Ia or Ib elements which substantially occupy the lattice sites of the Group II element, or Group Vb elements which substantially occupy the lattice sites of the Group VI element. Thus, these elements are expected to render the conductivity type of the crystal to the p type. There have been reported many results of experiments of impurity doping which rely on either the ion implantation technique or the diffusion technique. The result obtained on ZnSe crystals as well as the result of use of n type impurity elements are shown in Table 2.

TABLE 2

Impurity levels of various impurity elements in ZnSe crystal

| Impurity element | Conductivity type | Impurity Level Acceptor Level or Donor Level (eV) |
| --- | --- | --- |
| Li | p | 0.66 |
| Li | p | 0.114 |
| Na | p | 0.085–0.100 |
| Na | p | 0.09 |
| Cu | p | 0.072 |
| Cu | p | — |
| N | p | 0.136 |
| P | p | 0.68 |
| P | p | — |
| Ise | p | 0.68 |
| Vzn | p | ~0.1 |
| Ga · In | p | — |
| Al | n | 0.026 |
| Al | n | — |
| Ga | n | 0.028 |
| Ga | n | — |

TABLE 2-continued

Impurity levels of various impurity elements in ZnSe crystal

| Impurity element | Conductivity type | Impurity Level Acceptor Level or Donor Level (eV) |
| --- | --- | --- |
| In | n | 0.029 |
| F | n | 0.029 |
| Cl | n | 0.027 |
| Cl | n | — |

As will be apparent from the result of the p type impurity element mentioned, it is noted that, in any one of these impurity elements, there is formed an impurity level having a deep level, and the technique is considered to represent a doping technique which is not suitable for the fabrication of a desired semiconductor device. The reason therefor is considered to be that because no good crystal has been grown, the doped impurity cannot form a shallow level by itself alone no matter how much impurity is doped in the crystal, so that the impurity as well as such crystal defects as vacancies will tend to combine together to develop complex centers which will become deep levels.

SUMMARY OF THE INVENTION

It is, therefore, the object of the present invention to solve the above-stated drawbacks and problems of II-VI compound semiconductors encountered in the prior techniques and to provide a semiconductor device using a p type semiconductor crystal having a good crystallographic quality which is obtained by doping a Group Ia element such as Li, Na and K which serves as a p type impurity under controlled stoichiometry.

DETAILED DESCRIPTION OF THE PREFERRED EMBODIMENT

As in the instance of III-V compound semiconductors, a II-VI compound semiconductor is obtained usually by relying on the solution growth technique. A solution growth technique by which a good crystallographic quality is obtained is described in Japanese Patent Application No. Sho 56-69130 which represents an improved technique of the art disclosed in Japanese Patent Application No. Sho 55-149693 by the present inventor. In describing the present invention, this former application is referred to herein.

By adopting, during the solution growth process, the technique of controlling the vapor pressure of Group II or VI element which is a constituent element of the Group II-VI compound semiconductor used for the crystal growth, it is possible to minimize the deviation of the grown crystal from stoichiometry. This solution growth technique is such that, at the time of performing a solution growth of a II-VI compound semiconductor, one of the two constituent elements of the crystal being grown and having a higher vapor pressure than the other consituent element is used as a solvent or melt for the solution growth process, and moreover the ambient atmosphere of the process is composed of the vapor of the other constituent element having a lower vapor pressure to thereby accomplish the solution growth of crystal.

The values of the melting point, the density and the thermal conductivity of the constituent elements of the II-VI compound semiconductors which are employed in the present invention are enumerated in Table 3.

TABLE 3

| Element | Melting point (°C.) | Density (g/cm$^3$) | Thermal conductivity (W/cm · °K.) |
|---|---|---|---|
| Zn | 419.6 | 7.14 | 1.19 at 0° C. |
|  |  |  | 0.59 at 450° C. |
| Cd | 320.9 | 8.65 | 0.98 at 0° C. |
| S | 112.8 | 2.07 | 0.004 at 0° C. |
|  | 119.0 | 1.96 |  |
| Se | 217 | 4.80 | 0.0024 at 0° C. |
| Te | 449.5 | 6.24 | 0.015 at 0° C. |

Figure 1:
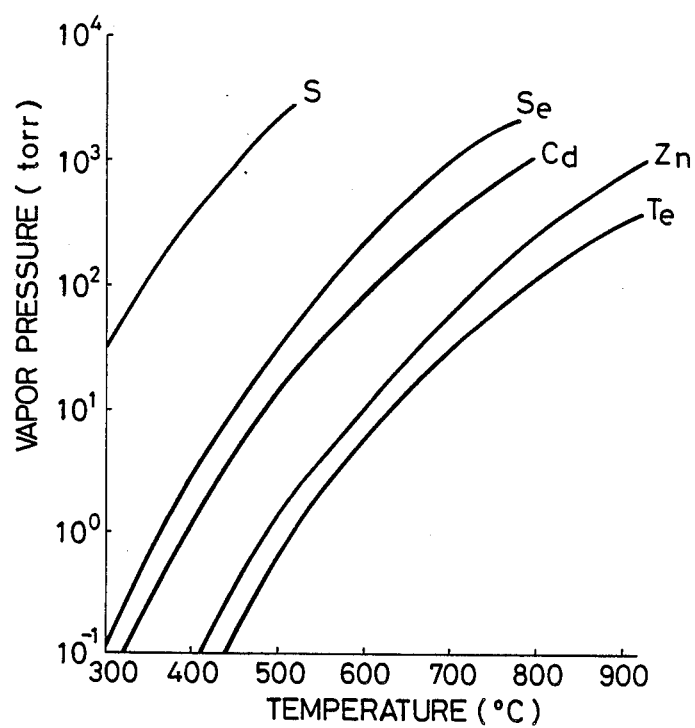
FIG. 1 is an illustration showing the temperature-vapor pressure curves of Group II elements and Group VI elements to explain the present invention.

Also, the temperature-vapor pressure relationship is shown in FIG. 1.

Thus, in the growth of a crystal according to the present invention, it is necessary to use, as a melt or solvent, either S or Se which is a Group VI element in the solution growth of such crystal as ZnS, ZnSe, CdS and CdSe, and to use an atmosphere comprised of the vapor of Zn or Cd while controlling the vapor pressure thereof. On the other hand, in the solution growth of ZnTe or CdTe, it is necessary to use the Group II element to serve as a melt, and to control the vapor pressure of the Group VI element.

As an example of obtaining a crystal of II-VI compound semiconductor, let us take up the case of ZnSe to describe the present invention in further detail.

Figure 2:
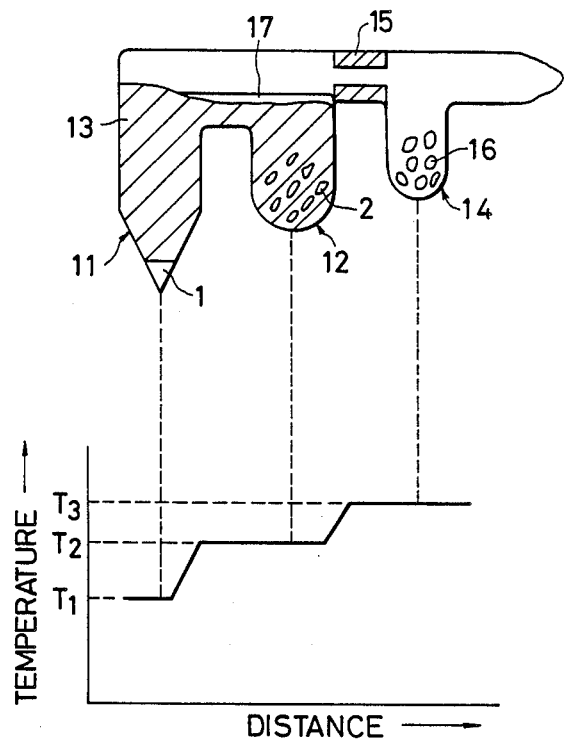
FIG. 2 is a diagrammatic representation of an example of the quartz ampule for use in the present invention in performing a crystal growth, and an example of the temperature distribution during the growth.

In case of a ZnSe crystal, the vapor pressure of Se, when compared with that of Zn, is higher by about one order at the same temperature, and therefore, Se is used as a melt or solvent. Since the density of Zn which constitutes the ZnSe crystal is greater than Se, Se has a smaller specific gravity than the ZnSe crystal. Accordingly, in a crystal growth, a source crystal of ZnSe is floated on an Se melt, and such operation requires a method so described in said Japanese Patent Application No. Sho 55-149693. Therefore, generally, in an instance wherein the specific gravity of the solvent or melt is smaller than the specific gravity of the source crystal which is to be grown, and accordingly in case the source crystal sinks in the melt or solvent, it is desirable to use the system as shown in FIG. 2. In case the abovesaid two specific gravities are in the reversed relationship, the source crystal may be floated in the melt, or alternatively the system of FIG. 2 may by employed. The arrangement shown in FIG. 2 is such that there is used a growth system comprised of a closed quartz ampule which is divided into three chambers. There is established a temperature difference $T_2-T_1$ between the zone 11 in which a crystal of ZnSe 1 recrystallizes (ZnSe crystal 1 will recrystallize easily at such a site as shown) and the zone 12 in which the source crystal 2 is set. The amount of the solvent or melt is determined in such a way as to satisfy the conditions that these two zones are filled with the Se melt 13 and are communicative to each other through a connecting tube. In addition, a chamber 14 for the introduction of Zn 16 is provided on the side opposite to the recrystallizing or crystal separating zone 11 from the source crystal zone 12. In order to thermally isolate these two zones or chambers 11 and 14 relative to each other, it is desirable to connect them with a narrow quartz tube. In practice, however, the thermal isolation is made possible by reducing the effective sectional area of the path of Zn vapor by inserting a tube 15 having a small inner diameter in such manner as shown in FIG. 2 after the materials have been introduced in the quartz ampule.

On the other hand, in an ampule containing two kinds of constituent elements having high vapor pressures (in this instance, they are Zn and Se), there will take place a reaction directly between Zn and Se. In order to suppress as much as possible such phenomenon from taking place, it is desirable to minimize the surface area of the Se melt which reacts against Zn vapor. For example, it is desirable to provide a quartz cover 17 at the site of the system corresponding to the ceiling of the source crystal zone.

In such arrangement as described above, the growth of a crystal is performed while maintaining the recrystallizing zone 11, the source crystal zone 12 and the Zn zone 14 at predetermined temperatures, respectively. There is established a substantially constant temperature difference between the recrystallizing zone and the source crystal zone throughout the growth process, to recrystallize the source crystal in the recrystallzing zone by relying on the difference in the amount of ZnSe which has been dissolved into the melt of the source crystal zone and the amount of ZnSe which is present in the melt of the recrystallizing zone, i.e. by virtue of the diffusion caused by the difference in the concentrations. The vapor pressure of Zn which forms in the atmosphere during the growth process is applied from the upper portion of the solution, and it is possible to control the Zn vapor pressure by altering only the temperature of the Zn zone without changing any other conditions of the crystal growth process. As a result of various experiments conducted by the inventor, it has been found that the range of the vapor pressure for causing a reduction of the density of deep level is from 0.1 to 10 atmospheric pressures, and above all, the range from 0.5 to 8 atmospheric pressures has been found suitable.

Also, in order to increase the solubility of the ZnSe source crystal which is the solute relative to the Se melt which is the solvent, it is necessary to elevate the temperature employed. However, as the temperature rises, the vapor pressure of Se will rise also. For example, as will be inferred from FIG. 1 also, the vapor pressure of Se at 900° C. is above 11 atmospheric pressure, so that this value approaches the limit of mechanical strength of the quartz tube per se.

In order to avoid this, it will be only necessary to place the whole quartz ampule in another tube or vessel having a greater mechanical strength, and to arrange so as to be able to maintain the external side of the quartz ampule at several to several tens of atmospheric pressures. By so arranging, it becomes possible to reduce the effective pressure which is applied to the quartz ampule. Accordingly, it becomes possible to carry out the growth of crystal at a high pressure. Also found as a result of the experiments is that a temperature of 800°-1150° C. is suitable for a growth temperature.

This system features that among those elements constituting II-VI compound semiconductors, the elements having a high vapor pressure are used to serve as a solvent or melt, and that the vapor pressure of the elements having a lower vapor pressure is controlled. Therefore, the growth system is not limited to such an arrangement as described just above, but various other modifications may be made, needless to say. This method is one which is not limited to ZnSe alone, but it can be applied equally effectively to the crystal growth of such compound semiconductors as ZnS, CdS, CdSe and CdTe also. It will not be needed to say either that, depending on the thermal conductivity of the materials used, the structure of the recrystallizing zone may be altered, and that a heat sink may be provided as required, and further that its configuration may be altered.

In the crystal growth process which has been described above, the selection of the impurity for rendering the crystal to the p type conductivity is important. As stated above, Group Vb elements will be rendered to the p type by their substitution with Group VI elements at the lattice site. Therefore, in case a Group VI element is used as a solvent or melt, it will be noted that, even when a Group Vb element is added thereto as an impurity, there hardly develops a substitution or exchange at the lattice site of the Group VI element. Therefore, in the present invention, it will be noted that it is effective to use either Group Ia or Ib element as a p type impurity, and while controlling the vapor pressure of a Group II element, the p type impurity is incorporated in the lattice site of the Group II element through atom exchange, and that thus, the acquisition of a p type crystal becomes much easier. Those impurities which correspond to such p type ones as mentioned above can be selected from the below-mentioned Periodic Table IV.

| Periodic TABLE IV | | | | | | | |
|---|---|---|---|---|---|---|---|
| Ia | Ib | IIb | IIIb | IVb | Vb | VIb | VIIb |
| Li | | | | | | | |
| Na | | | | | P | S | Cl |
| K | Cu | Zn | Ga | Ge | As | Se | Br |
| Rb | Ag | Cd | In | Sn | Sb | Te | I |
| Cs | Au | Hg | Tl | Pb | Bi | Po | |

After repeating various experiments, p type crystals have been obtained by the addition of such element as Li, Na and K of Group Ia among the Group Ia elements and Group Ib elements. It has been found that especially the use of Li is most suitable. As the manner of doping an impurity into the melt, it is of course good to add the element directly into the solvent or melt. However, because Li is a very active metal, it has been found through the experiments that a better result is obtained by the use of Li in a stable form such as in the form of a Li compound such as $LiSO_4$, $LiNO_3$ and LiCl. Also, as the amount of Li to be added, it has been found that the range of $1 \times 10^{-3} - 5 \times 10^{-1}$ mol% of Li relative to the solvent is one which develops a satisfactory p type semiconductor layer when a semiconductor device is fabricated. In particular, the range from $5 \times 10^{-3}$ to $2 \times 10^{-2}$ is most suitable. This amount is naturally correlated with the range of the vapor pressure which is placed under control. The range of the suitable vapor pressure placed under control is 0.1–15 atmospheric pressure, and the suitable vapor pressure of the constituent element serving as the solvent is in the range of 2–66 atmospheric pressures. More limitatively, the most suitable range of the former is 0.5–8 atmospheric pressures, while the latter is 10–40 atmospheric pressures.

By forming an n type semiconductor layer on top of this p type semiconductor substrate, it is possible to obtain a pn junction. It is needless to say that, by relying on such technique as an epitaxial growth of an n type layer, or a diffusion of an n type impurity, or a heat treatment in Zn melt, or an ion implantation, an n type layer can be easily formed.

As an example of fabrication of a semiconductor device using the p type crystal by relying on such method of the present invention as stated above, description will be made hereunder of an example of fabricating a ZnSe blue light emitting diode.

EXAMPLE

At predetermined sites within a quartz crucible having such structure as mentioned in FIG. 2, there is charged 12.7 g of Se serving as the melt, 3 g of ZnSe serving as the source crystal, 2 g of Zn for the control of vapor pressure, and 1.1 mg of $LiSO_4$ serving as a p type impurity source. The temperature difference $T_2 - T_1$ between the source crystal zone 12 and the recrystallizing zone 11 is set at 20° C. The source crystal zone, the recrystallizing zone and the vapor pressure control zone 14 are kept at 1120° C., 1100° C. and 1100° C., for 50 hours, respectively. Subsequently, the grown crystal is taken out of the system, and is held at 900° C. for 10-15 minutes in a Zn solution. Owing to the diffusion of Zn into the crystal, there is formed an n type layer having a thickness of 10–15 $\mu$m. Thereafter, an ohmic contact electrode is formed on each of the n type and p type regions, and thus a diode having a pn junction is fabricated. As an LED, a forward current is caused to flow through this device, and the light emission spectra at 77° K. is measured. The result is shown at 21 in FIG. 3.

By diffusing Au into the n type ZnSe crystal, a p type region is formed. The resulting device is used as a light emitting diode, and under the above conditions, the light emission spectra thereof is measured, and the result is shown at 22 in FIG. 3.

Figure 3:
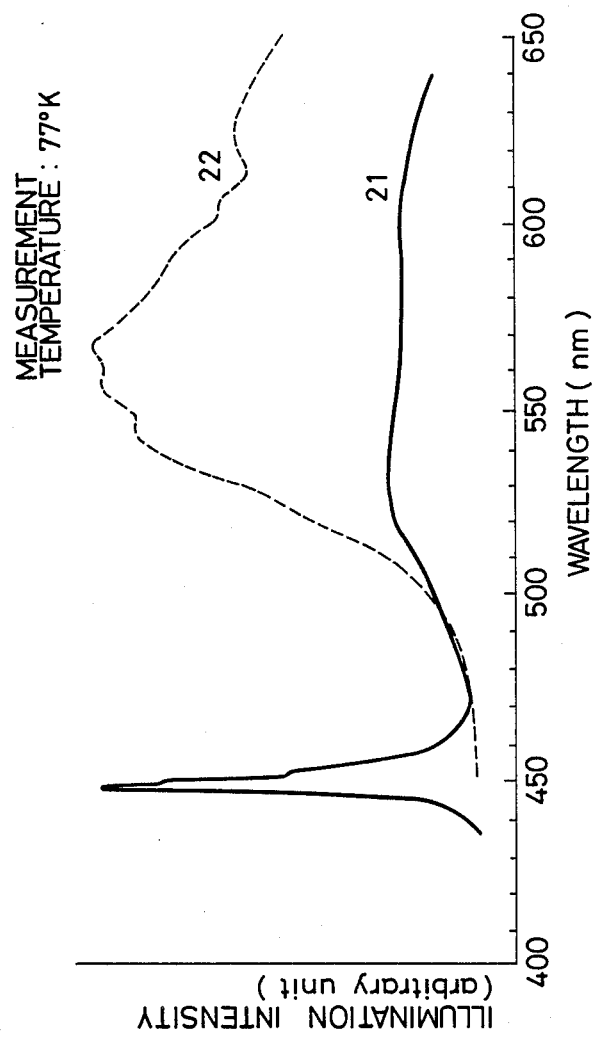
FIG. 3 is a chart showing an example of the light emission spectrum in case the present invention is applied to an LED.

As compared with the light emission spectra 22, the one shown at 21 in FIG. 3 is noted to represent a reduced light emission through a deep level. This indicates that, in the LED fabricated by relying on the technique of the present invention, there is a diminished formation of the deep level. An intensive and sharp peak is observed in the wavelength corresponding substantially to the energy of the energy band gap. In other words, a blue color light emitting diode has been materialized.

From said wavelength corresponding to the peak intensity of light emission at 77° K., its energy value is sought, and it has been noted to be 2.77 eV. The value of energy band gap of ZnSe at room temperature is 2.67 eV as shown in Table 1, but it is 2.8 eV at 77° K. Accordingly, the position of the acceptor level of the p type impurity in the present invention is about 0.03 eV or lower as measured from the top of the valence band, and thus it has been found that a very shallow acceptor level is formed.

The present invention has been described above with respect to the instance of using ZnSe as an example of II-VI compound semiconductor. However, the present invention will serve a very important role in providing a p type semiconductor crystal in case such II-VI compound semiconductors as ZnS, ZnTe, CdS and CdSe other than said ZnSe are used as the materials for the manufacture of semiconductor devices.

What is claimed is:

1. A method of making a semiconductor device made of a Group II-VI compound semiconductor comprised of one of Zn and Cd selected from Group II elements and one of S and Se selected from Group VI elements, and containing therein at least one p-n junction formed of a single crystal, by employing a solution growth process using a solvent comprised of one of said Group II or Group VI elements having a higher vapor pressure in said Group II-VI compound semiconductor and by controlling the vapor pressure of the other element having a lower vapor pressure and by doping, in said solvent, a p type impurity selected from Group Ia and Ib element in an amount ranging from $1\times10^{-3}$ to $5\times10^{-1}$ mol% to obtain a p type semiconductor crystal in said single crystal.

2. A method of making a Group II-VI semiconductor device comprised of a first element selected from the group of Zn and Cd and a second element selected from the group of S and Se, said semiconductor device having a single crystal p-n junction being made by a solution growth process comprising the steps of:
providing a solvent of one of said first and second elements having a higher vapor pressure in said Group II-VI semiconductor compound,
providing a vapor of the other of said first and second elements having a lower vapor pressure in said Group II-VI semiconductor compound,
controlling the pressure of said vapor, and
doping said solvent with a p type impurity in an amount between $1\times10^{-3}$ to $5\times10^{-1}$ mol%, said impurity being selected from the Group Ia and Ib elements, whereby to obtain a p type single crystal semiconductor device.

3. A method as recited in claim 2 wherein said Group Ia elements comprise Li, Na and K, and said Group Ib elements comprise Au, Ag and Cu.

4. A method as recited in claim 2 wherein said doping amount ranges between $5\times10^{-3}$ to $2\times10^{-2}$ mol%.

5. A method as recited in claim 2 wherein said solution growth process is conducted by relying on a temperature difference technique.

6. A method as recited in claim 2 further comprising carrying out said solution growth process in a closed quartz tube.

7. A method as recited in claim 6 wherein said closed quartz tube includes separate chamberscomprising a first chamber for crystal growth through recrystallization, a second chamber for containing a source crystal, and a third chamber in which the vapor pressure of an element is controlled.

8. A method as recited in claim 6 further comprising providing a pressurized gaseous atmosphere in said closed quartz tube selected from the group consisting of air, argon, and nitrogen.

9. A method as recited in claim 2 wherein said Group II-VI semiconductor compound comprises one of the groups f ZnSe, ZnS, CdS and CdSe.

10. A method as recited in claim 2 further comprising the step of controlling said pressure of said vapor between a range of 0.1 and 10.0 atmospheric pressures.

11. A method as recited in claim 2 wherein said semiconductor device fabricated thereby comprises a light emitting diode.

12. A method as recited in claim 11 wherein said light emitting diode comprises a ZnSe crystal.

* * * * *

UNITED STATES PATENT AND TRADEMARK OFFICE
CERTIFICATE OF CORRECTION

PATENT NO. : 4,783,426

DATED : November 8, 1988

INVENTOR(S) : NISHIZAWA

It is certified that error appears in the above-identified patent and that said Letters Patent is hereby corrected as shown below:

Col. 10, claim 7, line 2, "chamberscomprising" should read -- chambers comprising --;

claim 9, line 3, "groups f" should read -- groups of --.

Signed and Sealed this

Twelfth Day of September, 1989

*Attest:*

DONALD J. QUIGG

*Attesting Officer*         *Commissioner of Patents and Trademarks*